(12) United States Patent
Tokuda

(10) Patent No.: US 7,420,178 B2
(45) Date of Patent: Sep. 2, 2008

(54) RADIATION DETECTOR AND RADIATION IMAGING DEVICE EQUIPPED WITH THE SAME

(75) Inventor: Satoshi Tokuda, Kusatsu (JP)

(73) Assignee: Shimadzu Corporation (JP)

( * ) Notice: Subject to any disclaimer, the term of this patent is extended or adjusted under 35 U.S.C. 154(b) by 484 days.

(21) Appl. No.: 10/841,364

(22) Filed: May 7, 2004

(65) Prior Publication Data

US 2004/0256569 A1 Dec. 23, 2004

(30) Foreign Application Priority Data

Jun. 20, 2003 (JP) ............................. 2003-176041

(51) Int. Cl.
*H01L 31/00* (2006.01)
*G01T 1/24* (2006.01)

(52) U.S. Cl. ..................... 250/370.09; 250/370.01; 250/370.13; 378/98.8

(58) Field of Classification Search ........... 250/370.08, 250/370.09, 370.11, 370.13; 378/98.8
See application file for complete search history.

(56) References Cited

U.S. PATENT DOCUMENTS

| | | | | |
|---|---|---|---|---|
| 4,243,885 A * | 1/1981 | Agouridis et al. | ...... | 250/370.07 |
| 4,360,821 A * | 11/1982 | Tsukada et al. | ............. | 257/293 |
| 4,429,325 A * | 1/1984 | Takasaki et al. | ............. | 257/444 |
| 4,980,736 A * | 12/1990 | Takasaki et al. | ............... | 257/55 |
| 5,017,989 A * | 5/1991 | Street et al. | .................. | 257/291 |
| 5,101,255 A * | 3/1992 | Ishioka et al. | .................. | 257/52 |
| 5,313,066 A * | 5/1994 | Lee et al. | ................ | 250/370.09 |
| 5,319,206 A * | 6/1994 | Lee et al. | ................ | 250/370.09 |
| 5,396,072 A * | 3/1995 | Schiebel et al. | ........ | 250/370.09 |
| 5,661,309 A * | 8/1997 | Jeromin et al. | ............... | 250/580 |
| 5,801,385 A * | 9/1998 | Endo et al. | ............. | 250/370.11 |
| 5,880,472 A * | 3/1999 | Polischuk et al. | ...... | 250/370.09 |
| 6,075,256 A * | 6/2000 | Kaifu et al. | .................... | 257/53 |
| 6,118,851 A * | 9/2000 | Endo et al. | ................. | 378/98.8 |
| 6,310,351 B1 * | 10/2001 | Zur | ....................... | 250/370.09 |
| 6,340,818 B1 * | 1/2002 | Izumi et al. | ............ | 250/370.13 |
| 6,392,217 B1 * | 5/2002 | Teranuma et al. | ........ | 250/208.1 |
| 6,407,374 B1 * | 6/2002 | Sato et al. | ................ | 250/208.1 |
| 6,437,341 B1 * | 8/2002 | Izumi et al. | ............ | 250/370.13 |
| 6,469,305 B2 * | 10/2002 | Takabayashi et al. | ... | 250/361 R |
| 6,472,666 B2 * | 10/2002 | Izumi et al. | ............ | 250/370.08 |
| 6,483,099 B1 * | 11/2002 | Yu et al. | .................. | 250/214.1 |
| 6,510,195 B1 * | 1/2003 | Chappo et al. | ................ | 378/19 |
| 6,512,233 B1 * | 1/2003 | Sato et al. | ............. | 250/370.13 |
| 6,562,127 B1 * | 5/2003 | Kud et al. | ..................... | 117/94 |
| 6,590,224 B2 * | 7/2003 | Imai | .......................... | 250/591 |
| 6,723,995 B2 * | 4/2004 | Rougeot | ................ | 250/370.11 |

(Continued)

FOREIGN PATENT DOCUMENTS

JP 11183626 7/1999

(Continued)

*Primary Examiner*—David P. Porta
*Assistant Examiner*—Yara B Green

(57) ABSTRACT

An industrial or medical radiation detector and a radiation imaging device equipped with the radiation detector are presented. The device improves the detection properties and production efficiency of the radiation detectors. The device includes a conductive support substrate; a semiconductor sensitivity film stacked onto the support substrate and generating a carrier (electron, positive hole) in response to an item to be detected; and means for reading equipped with an element for accumulating and reading the carrier generated by the semiconductor sensitivity film.

10 Claims, 4 Drawing Sheets

U.S. PATENT DOCUMENTS

| | | | | |
|---|---|---|---|---|
| 6,933,505 B2 * | 8/2005 | Vuorela | ............... | 250/370.13 |
| 2002/0074503 A1 * | 6/2002 | Watanabe | ............. | 250/370.08 |
| 2002/0092991 A1 * | 7/2002 | Izumi | .................. | 250/370.09 |
| 2002/0092992 A1 * | 7/2002 | Izumi | .................. | 250/370.12 |
| 2002/0134943 A1 * | 9/2002 | Izumi | .................. | 250/370.09 |
| 2002/0195566 A1 * | 12/2002 | Rodricks et al. | ....... | 250/370.09 |
| 2004/0094721 A1 * | 5/2004 | Tokuda et al. | ......... | 250/370.13 |
| 2005/0051731 A1 * | 3/2005 | Sato et al. | ............. | 250/370.01 |
| 2005/0061985 A1 * | 3/2005 | Hoffman | ............... | 250/370.01 |
| 2005/0061987 A1 * | 3/2005 | Watadani et al. | ....... | 250/370.08 |
| 2005/0077473 A1 * | 4/2005 | Homme et al. | ......... | 250/370.11 |
| 2006/0027760 A1 * | 2/2006 | Rougeot et al. | ........ | 250/370.14 |

FOREIGN PATENT DOCUMENTS

JP          2001-242256 A1          9/2001

* cited by examiner

RADIATION DETECTOR AND RADIATION IMAGING DEVICE EQUIPPED WITH THE SAME

INCORPORATION BY REFERENCE

The present application claims priority under 35 U.S.C. §119 to Japanese Patent Application No. 2003-176041 filed on Jun. 20, 2003. The content of the application is incorporated herein by reference in its entirety.

BACKGROUND OF THE INVENTION

The present invention relates to an industrial or medical radiation detector and a radiation imaging device equipped with the same. More specifically, the present invention relates to technology for improving detection characteristics and production efficiency for radiation detectors.

High-sensitivity radiation detectors are developed for industrial and medical radiation detectors. An insulative body such as aluminum oxide, silicon carbide, or the like is used as a support substrate of the radiation detector. A CdTe, CdZnTe (cadmium lead telluride) crystal is used as a semiconductor sensitivity film. Also, accumulation/reading elements are arranged to correspond to the two-dimensional array of detector elements for accumulating and reading carriers (electrons, positive holes) generated by the semiconductor sensitivity film in response to exposure to the radiation being detected. The generated carriers are collected element by element (see Japanese laid-open patent document publication number 2001-242256).

However, this type of conventional technology has the following problems.

When the support substrate is an insulative body, a shared electrode must be included between the support substrate and the semiconductor sensitivity film and a bias voltage must be supplied to the shared electrode. Thus, wiring involving fine processing is required. More specifically, since the shared electrode is thin, wiring to supply the bias voltage from a side surface is difficult. Actual processing may involve cutting away a section of the support substrate to connect the shared electrode or to make an electrical connection via a through-hole. Thus, complexity is added to the manufacturing process. Also, since this shared electrode is thin, the electrical resistance is high, leading to variations in the detector bias voltage and reduction in the sensitivity of the radiation detector.

OBJECT AND SUMMARY OF THE INVENTION

The object of the present invention is to overcome these problems and to provide a radiation detector and a radiation imaging device equipped with the same that improves production efficiency and detection characteristics.

The present invention can have the following structures in order to achieve the objects described above.

A first implementation of the invention includes: a support substrate having conductivity; a semiconductor sensitivity film layered on the support substrate and generating carriers (electrons, positive holes) in response to an object to be detected; and reading menas having a carrier accumulating/reading element for accumulating and reading carriers generated by the semiconductor sensitivity film.

(Operations and advantage) With the first implementation of the invention, the support substrate has conductivity so that a bias voltage can be applied directly to the support substrate. Since there is no need to provide a common electrode, production efficiency can be improved.

Also, since the conductive support substrate has an adequately low electrical resistance, variations in the bias voltage can be limited. As a result, noise can be reduced, the S/N ratio (signal-to-noise ratio) can be kept high, and superior time responsiveness can be provided. Thus, detection characteristics can be improved.

A second implementation of the invention provides a radiation detector in which the support substrate is graphite.

(Operations and advantages) With the second implementation of the invention, the high transmittivity of graphite for radiation reduces the absorption and diffusion of transmitted radiation. Thus, the radiation (signal) entering into the semiconductor sensitivity film is increased and the carrier generation efficiency is increased. This provides a high S/N ratio and good detection characteristics.

Also, graphite has a high heat conduction, providing uniform film thickness and film quality when forming films. Also, the thermal expansion coefficient of graphite can be made roughly the same as the thermal expansion coefficient of the CdTe film, the ZnTe film, or a mixed crystal film thereof. As a result, when the semiconductor sensitivity film is formed on the support substrate, the warping, cracking, and peeling of the substrate caused by differences in the thermal expansion coefficients can be prevented. This makes it possible to manufacture large-area radiation detectors easily.

The first implementation of the invention provides a radiation detector in which the semiconductor sensitivity film is CdTe (cadmium telluride), ZnTe (zinc telluride), or a mixed crystal thereof.

(Operations and advantages) In a third implementation of the invention, the ionization energy of the semiconductor sensitivity film can be kept low and the thickness can be made high, thus providing high carrier generation abilities for a high-sensitivity radiation detector. Also, warping, cracking, and peeling of the film can be prevented, making it easy to manufacture a large-area radiation detector.

A fourth implementation of the invention provides a radiation detector in which a carrier blocking layer for blocking entry of carriers to the semiconductor sensitivity film is disposed between the support substrate and the semiconductor sensitivity film and/or between the semiconductor sensitivity film and the reading means.

(Operations and advantages) With the fourth implementation of the invention, the presence of a carrier blocking layer prevents leakage of carriers not contributing to sensitivity into the semiconductor sensitivity film, thus preventing leakage current. As a result, detection characteristics can be improved. For example, if the blocking layer is a positive-hole blocking layer, electrons having superior transport characteristics generated by the semiconductor sensitivity film can serve as primary carriers. Thus, superior time responsiveness can be provided.

A fifth implementation of the invention provides a radiation imaging device equipped with a radiation detector The implementation includes means for storing signals output from the radiation detector; means for arithmetic processing generating one-dimensional or two-dimensional image data based on the stored signal; and means for displaying outputting a one-dimensional or two-dimensional image generated by arithmetic processing means.

(Operations and advantages) With the fifth implementation of the, the signals output from the radiation detector in response to radiation are stored in storing means. The stored signals are read by arithmetic processing means at appropriate times and undergo various arithmetic processing operations to generate one-dimensional or two-dimensional image data. The generated one-dimensional or two-dimensional image data is output as a two-dimensional image display on displaying means. By using the radiation detector described above, a one-dimensional or two-dimensional image with high spatial resolution can be obtained.

DETAILED DESCRIPTION OF THE PREFERRED EMBODIMENTS

First Embodiment

Figure 1:
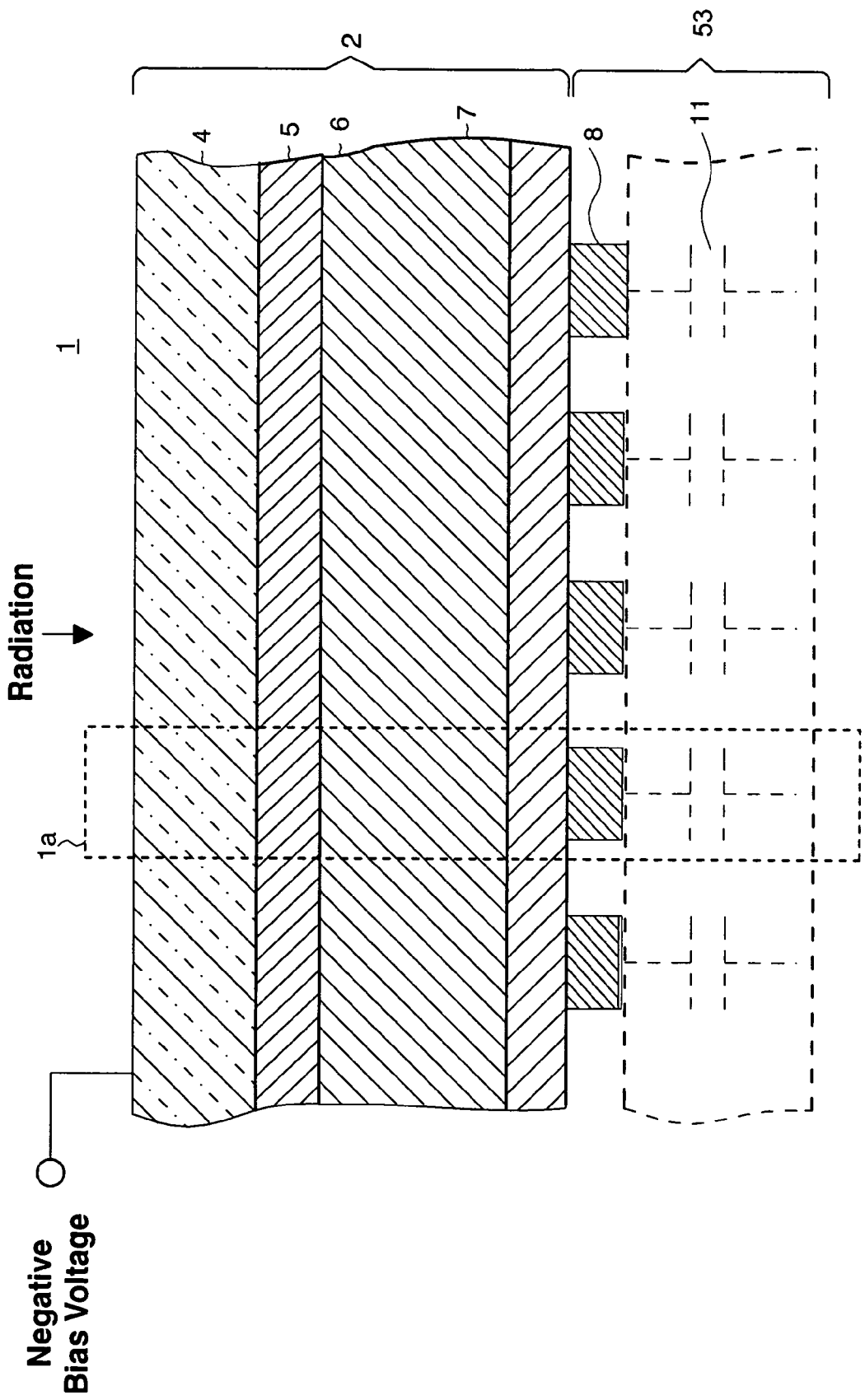
FIG. 1 is a cross-section drawing showing the structure of an embodiment of a radiation detector according to a first embodiment.
Figure 2:
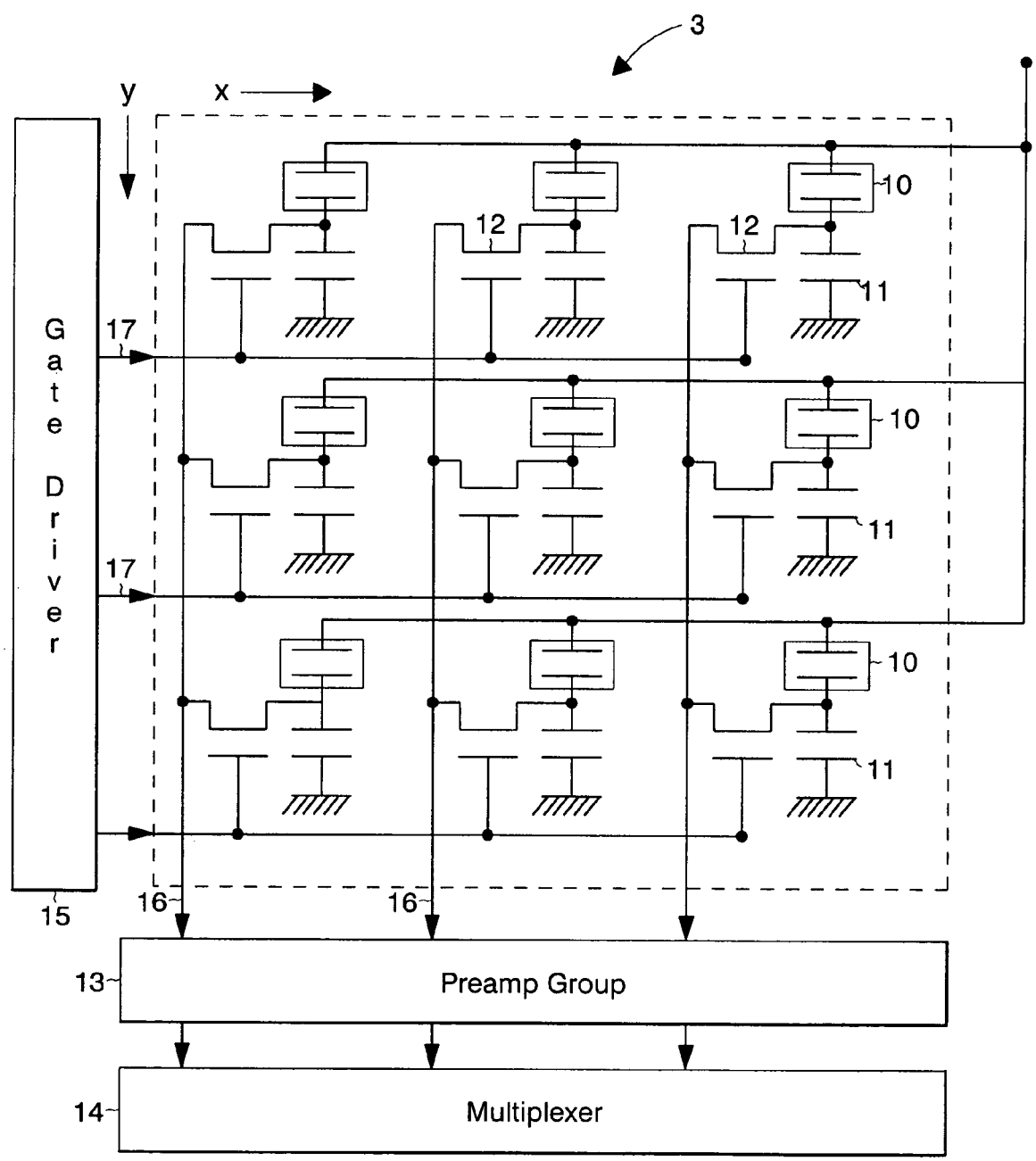
FIG. 2 is a simplified circuit diagram showing an equivalent circuit of a radiation detector.
Figure 3:
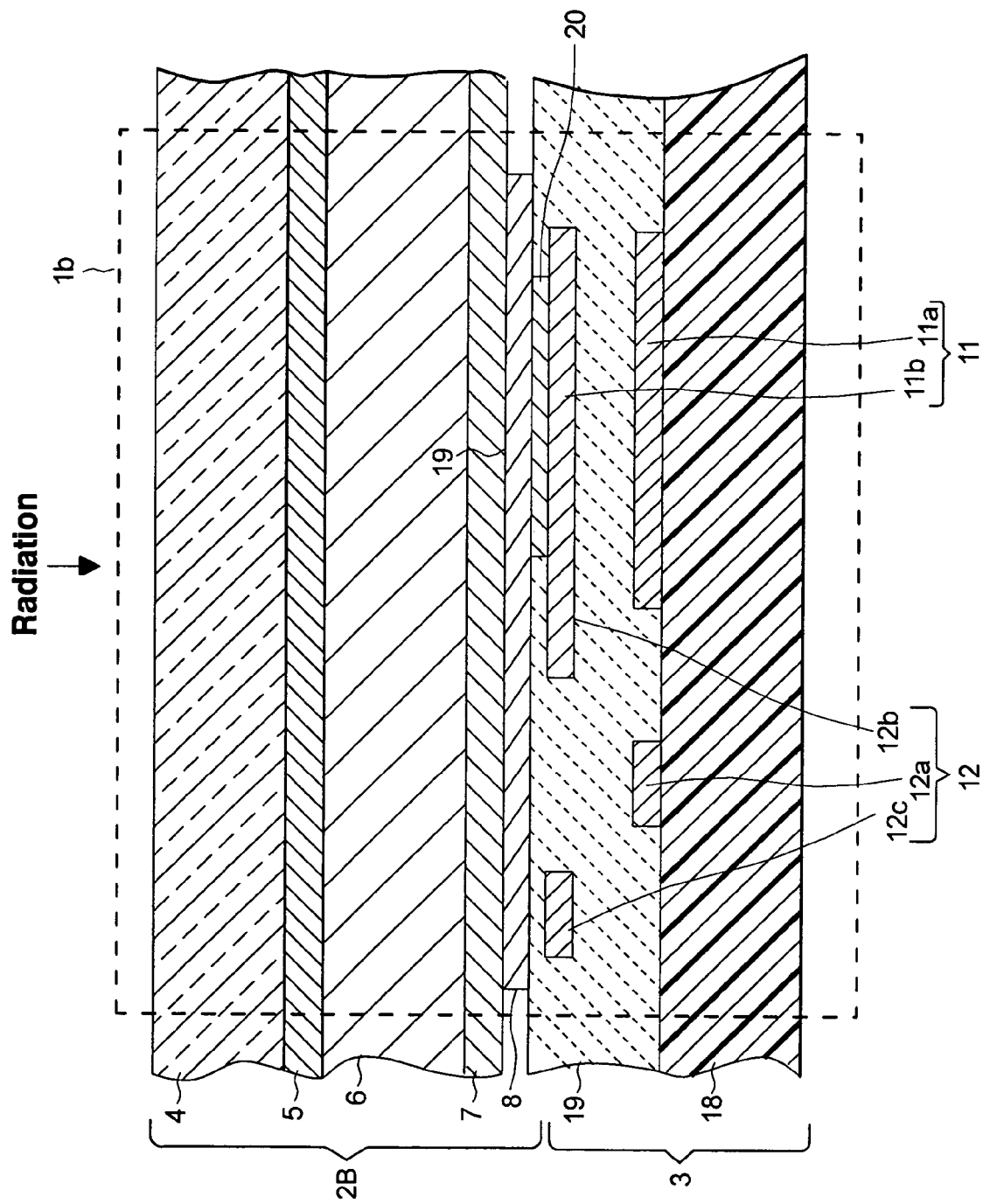
FIG. 3 is a cross-section drawing showing the structure of a single detection element in a radiation detector.

FIG. 1 is a cross-section drawing showing the structure of a radiation detector according to the first embodiment. FIG. 2 is a circuit diagram showing a simplified equivalent circuit of a radiation detector according to the first embodiment. FIG. 3 is a cross-section drawing showing the structure of a single detector element in a radiation detector according to the first embodiment.

A radiation detector 1 according to the first embodiment is formed by bonding a detection-side substrate 2 for detecting radiation and a reading-side substrate (active matrix substrate) 3 for accumulating and reading generated carriers.

The detection-side substrate 2 generates carriers (electrons, positive holes) in response to incoming radiation, and these generated carriers are collected by individual elements and then retrieved. The elements of the radiation detector 1 according to the first embodiment will be described in more detail.

As shown in FIG. 1, the detection-side substrate 2 is formed, going in sequence from the side receiving radiation, from a support substrate 4, an electron blocking layer 5 serving as a carrier blocking layer, a semiconductor sensitivity film 6 responding to radiation and generating carriers, a positive-hole blocking layer 7 serving as a carrier blocking layer, and an image element electrode 8.

The support substrate 4 in this embodiment is formed from a graphite made from a conductive carbon. In this embodiment, the thickness is 2 mm. Also, it is preferable to have the thermal expansion coefficient of the support substrate 4 be roughly the same as the thermal expansion coefficient of a member stacked on its back surface (toward the bottom in FIG. 1).

By having the thermal expansion coefficients of the two members be close to each other, it is possible to prevent the support substrate 4 from warping due to significantly different thermal expansion coefficients between the support substrate 4 and the member layered on its back surface. This also prevents the peeling away of the image element electrode 8 and the like. For example, if the material for the semiconductor sensitivity film 6, described later, is CdTe, the thermal expansion coefficient can be set to 5 ppm/deg, that of ZnTe can be set to 8 ppm/deg, and that of CdZnTe can be set within a range of 5-8 ppm/deg depending on the Zn concentration. This provides roughly similar thermal expansion coefficients for the two members.

The electron blocking layer 5 is formed by performing sublimation, vaporization, sputtering, chemical deposition, electrodeposition, or the like with a P-type semiconductor such as ZnTe or $Sb_2S_3$ (antimony sulfide).

The semiconductor sensitivity film 6 is a film made from zinc telluride (ZeTe) or cadmium telluride (CdTe) formed through MOCVD (Metal Organic Chemical Vapor Deposit system), proximity sublimation, powder burning, or the like, or a mixed crystal of the two. This embodiment is for a radiation detector detecting energy in a range from several dozen to several hundred keV of energy, so a CdZnTe film is formed using proximity sublimation with a thickness of several hundred microns and a Zn content in a range of several-several dozen mol %.

The positive hole blocking layer 7 is formed by performing sublimation, vaporization, sputtering, chemical deposition, electrodeposition, or the like using a high-resistance N-type semiconductor such as CdS (cadmium sulfide), ZnS (zinc sulfide), ZnO (zinc oxide), $Sb_2S_3$, or the like.

Next, in the reading-side substrate 3 as shown in FIG. 2, each detection element 10 is associated with a capacitor 11 serving as a charge accumulating element and a thin-film transistor (TFT) 12 serving as a reading element.

FIG. 2 shows nine elements arranged in a 3×3 (image element) matrix in order to simplify the discussion, but in the detection-side substrate 2 according to this embodiment, detection elements 10 form a two-dimensional array arranged as 1000-3000 (v)×1000-3000 (h) according to the necessary image element count. On the reading-side substrate 3, the same number of capacitors 11 and thin-film transistors 12 as the image element count are arranged in a corresponding two-dimensional array.

FIG. 3 shows the detailed structure of the capacitor 11 and the thin-film transistor 12 in a section 1a surrounded by dotted lines in the reading-side substrate 3 shown in FIG. 1. A ground-side electrode 11a of the capacitor 11 and a gate electrode 12a of the thin-film transistor 12 is formed on the surface of an insulative substrate (circuit substrate) 18. Layered over this, separated by an insulative film 19, are a connection-side electrode 11b of the capacitor 11 and a source electrode 12b and a drain electrode 12c of the thin-film transistor 12. The surface side is covered by the insulative film 19, except for the connection-side electrode 11b. The connection-side electrode 11b and the source electrode 12b are connected integrally and are formed together. Furthermore, the insulative film 19, which serves as both the capacitance insulation film for the capacitor 11 and the gate insulation film for the thin-film transistor 12, can be formed from a plasma SiN film or the like.

This reading-side substrate 3 is formed using thin-film technology and fine processing technology as are used in the production of active matrix substrates for liquid crystal displays.

As shown in FIG. 2, the reading-side substrate 3 uses a flexible printed substrate (FPC) and is connected to a gate driver 15, a multiplexer 14, and a preamp (charge-voltage converter) group 13 serving as a reading driver circuit. These reading driver circuits use ICs (integrated circuits), e.g., silicon semiconductors. The pre-amp group 13 is connected to lateral (Y) direction read lines (read address line) 16 connecting the drain electrodes of thin-film transistors 12 along an individual column. The gate driver 15 is connected to lateral (X) direction read lines (gate address line) 17 connecting the gate electrodes of thin-film transistors 12 along an individual row. In the pre-amp group 13, there is one pre-amp that is connected to each read line 16. Also, each reading driver circuit is connected to the reading lines 16, 17 by way of an anisotropic conductive film (ACF) or the like.

In the reading-side substrate 3 as described above, the reading driver circuits are set up externally and connected electrically. However, polysilicon TFT manufacture technology can be used to mount all or part of the reading driver circuits integrally with the reading-side substrate 3, thus providing a higher degree of integration and superior features.

Next, radiation detection performed by the radiation detector 1 according to the first embodiment presented above will be described.

The semiconductor sensitivity film 6 generates carriers in response to exposure of the semiconductor sensitivity film 6 to radiation from above the support substrate 4. The semiconductor sensitivity film 6 receives a bias voltage from the graphite support substrate 1 in order to allow efficient collection by the image element electrode 8 of the carriers generated in response to radiation exposure (in this embodiment, the bias voltage is a negative bias of −0.1−1 V/micron). Since the thin-film transistor 12 will be off until the next read operation takes place, the generated carriers continue to be stored as a charge in the capacitor 11.

A signal read scan signal is sent to the gate driver 15 and the multiplexer 14 of the reading-side substrate 3. Individual detection elements 10 are specified based on addresses (e.g., 0-1023) assigned sequentially to the detection elements going down the X direction and the Y direction. Thus, a retrieval scan signal is a signal that indicates an X-direction address or a Y-direction address.

As a read voltage is applied from the gate driver 15 to the X-direction read line 17 based on the Y-direction scan signal, an individual detection element 10 is selected by row. Then, when the multiplexer 14 switches in response to the X-direction scan signal, the thin-film transistor 12 corresponding to the detection element (image element) 10 at the selected row/column position is turned on (made conductive). At the same time, the charge stored in the capacitor 11 is read as a detection signal (image element signal) by way of the pre-amp group 13 and the multiplexer 14.

Image processing is then applied to the detection signal read in this manner, and the result is sent to a display device (monitor) such as a CRT, a liquid crystal display, or a PDP, and displayed as a two-dimensional image.

Next, the making of the radiation detector 1 will be described.

Starting with the surface of the support substrate 4 opposite from the incoming radiation, the detection-side substrate 2 is formed with an electron blocking layer 5, a semiconductor sensitivity film 6, and a positive-hole blocking layer 7. These layers are formed through sublimation, vaporization, or sputtering.

The finished detection-side substrate 2 is aligned with the reading-side substrate 3, and then the two substrates 2, 3 are made mechanically integral by adhesing the substrates 2, 3 using an anisotropic conductive film (ACF), an anisotropic conductive paste (ACP), a dry film resist (DFR), or the like. With the substrates 2, 3 adhesed in this manner, the positive hole blocking layer 7 and the connection-side electrode 11*b* are electrically connected by the interposed image element electrode 8 and a conductive section 20, as shown in FIG. 3.

With the radiation detector 1 described above, there is no need to provide a common electrode, thus improving production efficiency. Also, the thermal expansion coefficients of the support substrate 4 and the semiconductor sensitivity film 6 are made roughly the same, so warping, cracking, and peeling of the film is prevented and a large-screen radiation detector can be produced easily.

With the graphite support substrate 4, the absorption and diffusion of transmitted radiation can be reduced, thus increasing the S/N ratio and providing good detection characteristics.

With the electron blocking layer 5 and the positive hole blocking layer 7, leaked carriers that do not contribute to sensitivity can be prevented from entering the semiconductor sensitivity film 6, thus limiting leakage current. As a result, detection characteristics can be improved. Also, with the positive hole blocking layer 7, electrons with superior transport characteristics generated by the semiconductor sensitivity film can serve as carriers, thus providing superior time responsiveness.

Second Embodiment

In this embodiment, a radiation imaging device that uses the radiation detector according to the first embodiment presented above will be described.

Figure 4:
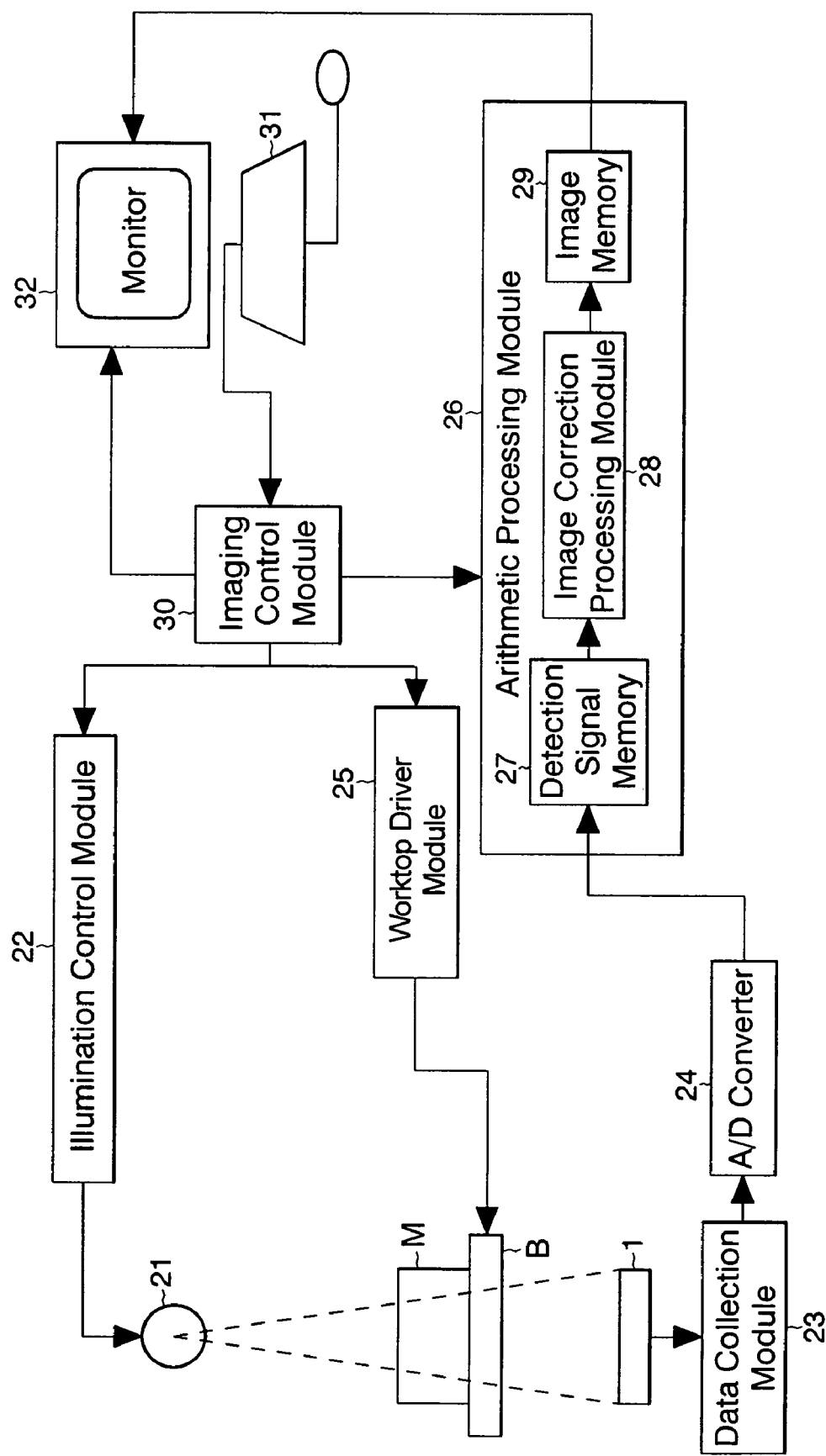
FIG. 4 is a block diagram of an embodiment of a radiation imaging device according to a second embodiment.

FIG. 4 shows a block diagram of the overall structure of a radiation imaging device according to a second embodiment. A detailed description of the structure will be described using FIG. 4. The structure of the radiation detector 1 for detecting radiation is described above, so a detailed description will be omitted here.

In the radiation imaging device of this embodiment, an X-ray tube 21 applying radiation, in the form of X-rays, to a body M upon which detection is to be performed and the radiation detector 1 detecting X-rays transmitted through the body M are disposed facing each other interposed by the body M mounted on a worktop B. At a late stage in the control-system side of the radiation detector 1, a two-dimensional image of the body M is provided based on a X-ray detection signal output from the radiation detector 1 in response to the application of X-rays to the body M.

The X-ray tube 21 for applying X-rays is set up to apply X-rays to the body M according to illumination settings, e.g., tube voltage and tube current, based on control from an illumination control module 22.

The radiation detector 1 detects transmitted X-rays from the body M and outputs an X-ray detection signal.

The X-ray detection signal output from the radiation detector 1 has a signal strength corresponding with the attenuation of the X-ray due to the body M. This signal is stored in a data collection module 23 and is converted to a digital signal by an A/D converter 24. The detection signal converted to a digital signal is then stored in a detection signal memory 27 of an arithmetic processing module 26. The detection signal memory 27 corresponds to storing means of the present invention.

The worktop B for moving the body is controlled by a worktop driver module 25 so that it can be moved, e.g., forward/back and left/right relative to the longitudinal axis of the worktop while the body M is mounted on the worktop.

The control-system side of the device of this embodiment includes: an arithmetic processing module 26 performing various necessary signal processing operations based on the digital signal output from the radiation detector 1 in response to X-ray illumination; and a monitor 32 displaying a two-dimensional X-ray image obtained by these necessary signal processing operations. The arithmetic processing module 26 corresponds to arithmetic processing means of the present invention, and the monitor 32 corresponds to displaying means of the present invention.

The arithmetic processing module 26 further includes: a detection signal memory storing a digital signal that has undergone A/D conversion; an image correction processing module 28 generating sharp two-dimensional image data by continuously reading data stored in the detection signal memory 27 and performing various signal processing operations; and an image memory 29 storing output image data processed by the image correction processing module 28.

The operations performed by the image correction processing module 28 can be, for example, operations for generating a two-dimensional X-ray image such as edge emphasis, filtering, or digital subtraction (DSA), and correction calculation processing to eliminate variations in the signal strength of the X-ray detection signal.

An imaging control module 30 provides control by sending instructions and data to the various module based on the progression of the imaging operations and input of instructions, numerical data, and the like via an operating module 31.

The radiation imaging device having the structure described above operates in the following manner.

First, transmitted X-rays radiated from the X-ray tube 21 and transmitted through the body M are detected by the radiation detector 1 and X-ray detection signals output from the radiation detector 1 are continuously stored in the data collection module 22. The stored X-ray detection signal is converted to a digital signal by the A/D converter 25 and stored in the detection signal memory 27 of the arithmetic processing module 26.

At appropriate times, the image correction processing module 28 reads the signals stored in the detection signal memory 27 and perform various correction operations to generate two-dimensional output image data. The generated image data is stored in the image memory 29. The stored image data is displayed on the monitor 32 as a two-dimensional X-ray image based on instructions from the operating module 31 operated by an operator. In addition to the monitor 32, the two-dimensional X-ray image output can be sent to an image printing device that prints an image to film as an image photo.

With a radiation imaging device equipped with a radiation detector 1 according to the first embodiment as described above, it is possible to obtain good two-dimensional X-ray images with high spatial resolution.

The present invention is not limited to the embodiments described above, and the following alternative embodiments are possible.

(1) In the embodiments described above, the reading-side substrate 3 is an active matrix substrate, but in the device of the present invention, a radiation detector equipped with a single switching element can be used, with the substrate being a switching matrix substrate with a one-dimensional array arrangement.

(2) In the embodiments described above, the electron blocking layer 5 is interposed between the support substrate 4 and the semiconductor sensitivity film 6, and the positive-hole blocking layer 7 is interposed between the semiconductor sensitivity film 6 and the image element electrode 8. However, in the device of the present invention, it is possible to include only the electron blocking layer 5 or the positive-hole blocking layer 7.

(3) In the embodiments described above, the positive-hole blocking layer 7 covers roughly the entire surface of the semiconductor sensitivity film 6. In the device of the present invention, however, the positive-hole blocking layer 7 can be formed as a two-dimensional array corresponding to the image element electrode 8.

(4) In the second embodiment described above, a two-dimensional image is displayed as output, but it would also be possible to display a one-dimensional image as output.

(5) X-rays are used as an example of radiation to be detected by the present invention, but the present invention can be used for detecting other types of radiation, e.g., gamma rays.

As the description above shows, the support substrate of the present invention has conductivity so that a bias voltage can be applied directly to the support substrate. This makes it possible to simplify the structure by eliminating the need for a common electrode. As a result, production efficiency can be increased.

What is claimed is:

1. A radiation detector comprising:
    a graphite support substrate having conductivity, said support substrate configured to be a bias electrode;
    a semiconductor sensitivity film formed by vapor deposition layered on said support substrate and generating carriers in response to an object of detection, wherein the semiconductor sensitivity film is CdTe (cadmium telluride), ZnTe (zinc telluride), or a mixed crystal thereof and
    a reading means having a carrier accumulating/reading element for accumulating and reading carriers generated by said semiconductor sensitivity film.

2. A radiation detector according to claim 1 wherein
    a carrier blocking layer for blocking entry of carriers to said semiconductor sensitivity film is disposed between said support substrate and said semiconductor sensitivity film and/or between said semiconductor sensitivity film and said reading means.

3. A radiation detector according to claim 1 wherein an electron blocking layer is interposed between the support substrate and the semiconductor sensitivity film.

4. A radiation detector according to claim 1 wherein
    a positive-hole blocking layer is disposed next to the semiconductor sensitivity film on a side away from the support substrate.

5. A radiation detector according to claim 1 further comprising:
    an image element electrode; and
    a positive-hole blocking layer being interposed between the semiconductor sensitivity film and the image element electrode.

6. A radiation imaging device according to claim 5, wherein the positive-hole blocking layer covers roughly an entire surface of the semiconductor sensitivity film.

7. A radiation imaging device according to claim 5, wherein the positive-hole blocking layer is formed as a two-dimensional array corresponding to the image element electrode.

8. A radiation imaging device according to claim 1, wherein said device displays a one or two-dimensional image.

9. A radiation imaging device according to claim 1, wherein said device detects X-rays or gamma rays.

10. A radiation detector comprising:
    a support substrate having conductivity, said support substrate configured to be a bias electrode;
    a semiconductor sensitivity film layered on said support substrate and generating carriers in response to an object of detection;
    a positive-hole blocking layer being disposed next to the semiconductor sensitivity film on a side away from the support substrate; and
    a reading means having a carrier accumulating/reading element for accumulating and reading carriers generated by said semiconductor sensitivity film.

* * * * *